United States Patent
Wu

(10) Patent No.: US 10,429,878 B2
(45) Date of Patent: Oct. 1, 2019

(54) TEST DEVICE

(71) Applicant: eMemory Technology Inc., Hsinchu (TW)

(72) Inventor: Yu Wu, Hsinchu County (TW)

(73) Assignee: eMemory Technology Inc., Hsinchu (TW)

(*) Notice: Subject to any disclaimer, the term of this patent is extended or adjusted under 35 U.S.C. 154(b) by 0 days.

(21) Appl. No.: 16/242,010

(22) Filed: Jan. 8, 2019

(65) Prior Publication Data
US 2019/0212763 A1 Jul. 11, 2019

Related U.S. Application Data

(60) Provisional application No. 62/615,463, filed on Jan. 10, 2018.

(30) Foreign Application Priority Data

Nov. 21, 2018 (TW) .............................. 107141435 A

(51) Int. Cl.
*G05F 3/26* (2006.01)
*G05F 1/575* (2006.01)
*H03F 1/34* (2006.01)

(52) U.S. Cl.
CPC .............. *G05F 3/262* (2013.01); *G05F 1/575* (2013.01); *H03F 1/34* (2013.01); *H03F 1/342* (2013.01)

(58) Field of Classification Search
CPC ............. G05F 3/262; H03F 1/34; H03F 1/342
USPC ......................................... 323/312, 315–317
See application file for complete search history.

(56) References Cited

U.S. PATENT DOCUMENTS

| 5,760,640 A | 6/1998 | Girard et al. |
| 5,841,271 A * | 11/1998 | Nakayama ............... G05F 1/465 323/316 |
| 5,880,624 A * | 3/1999 | Koyanagi ............ H03K 17/167 323/313 |
| 5,973,486 A * | 10/1999 | Van Auken ...... G01R 19/16538 323/274 |
| 2006/0125463 A1 | 6/2006 | Yen et al. |
| 2016/0154032 A1* | 6/2016 | Kuramochi ............. G05F 1/561 324/120 |
| 2016/0191008 A1* | 6/2016 | Bergren .................. H03F 1/342 381/61 |

* cited by examiner

*Primary Examiner* — Gary A Nash
(74) *Attorney, Agent, or Firm* — JCIPRNET

(57) ABSTRACT

A test device is provided. An output terminal of an operational amplifier is coupled to a device under test. A current replication circuit copies a current flowing through a charging circuit and a discharge circuit according to voltages of control terminals of the charging circuit and the discharge circuit in the operational amplifier and outputs a test result signal.

15 Claims, 5 Drawing Sheets

TEST DEVICE

CROSS-REFERENCE TO RELATED APPLICATION

This application claims the priority benefits of U.S. provisional application Ser. No. 62/615,463, filed on Jan. 10, 2018 and Taiwan application serial no. 107141435, filed on Nov. 21, 2018. The entirety of each of the above-mentioned patent applications is hereby incorporated by reference herein and made a part of this specification.

BACKGROUND OF THE INVENTION

Field of the Invention

The invention relates to an electronic device, and more particularly, to a test device.

Description of Related Art

As the manufacturing process of semiconductor chips becomes more and more refined, the probability of errors occurring during manufacture increases. Through testing, defective parts or defective chips may be selected. For example, during the channel testing of a memory chip, if a memory cell is tested to be defective, then the defective memory cell may be repaired by redundant memory cells in the semiconductor chip. However, as the chip becomes more complex, factors affecting the accuracy of the test also increase. For example, factors such as characteristic variations (such as corner variations), temperature, or input current level caused by process variation all affect the test results. In addition, the traditional chip test method often needs to specify a current flow direction when performing a chip test, which will lower the test speed and cause insufficient test efficiency. Therefore, there is an urgent need for a test device that may improve the test accuracy and the test efficiency of the chip.

SUMMARY OF THE INVENTION

The invention provides a test device structure that may effectively improve the accuracy and test efficiency of a chip test.

A test device of the invention includes an operational amplifier and a current replication circuit. The output terminal of the operational amplifier is coupled to the negative input terminal of the operational amplifier to form a negative feedback path, and the operational amplifier includes a charging circuit and a discharge circuit. The charging circuit provides at least one charging path from the operating voltage of the operational amplifier to the output terminal of the operational amplifier. The common junction of the discharge circuit and the charging circuit is coupled to the output terminal of the operational amplifier to provide at least one discharge path from the output terminal of the operational amplifier to the ground voltage, wherein the output terminal of the operational amplifier is coupled to a device under test. The current replication circuit is coupled to the control terminals of the charging circuit and the discharge circuit and copies the current flowing through the charging path and the discharge path according to the voltages of the control terminals of the charging circuit and the discharge circuit to output a test result signal.

In an embodiment of the invention, the charging circuit includes at least one first P-type transistor, the discharge circuit includes at least one first N-type transistor, the first P-type transistor is coupled between the operating voltage and the output terminal of the operational amplifier to provide a first charging path, and the first N-type transistor is coupled between the output terminal of the operational amplifier and the ground voltage to provide a first discharge path.

In an embodiment of the invention, the current replication circuit includes at least one second P-type transistor and at least one second N-type transistor, wherein the second P-type transistor is connected in series between the operating voltage and the output terminal of the current replication circuit, the second N-type transistor is connected in series between the output terminal of the current replication circuit and the ground voltage, and the gates of the second P-type transistor and the second N-type transistor are respectively coupled to the gates of the corresponding first P-type transistor and the corresponding first N-type transistor.

In an embodiment of the invention, the charging circuit further includes at least one third P-type transistor, the discharge circuit includes at least one third N-type transistor, the third P-type transistor and the third N-type transistor are connected in series between the operating voltage and the ground voltage, the third P-type transistor provides a second charging path, and the third N-type transistor provides a second discharge path.

In an embodiment of the invention, the current replication circuit further includes at least one fourth P-type transistor and at least one fourth N-type transistor, wherein the fourth P-type transistor and the fourth N-type transistor are connected in series between the operating voltage and the ground voltage, and the gates of the fourth P-type transistor and the fourth N-type transistor are respectively coupled to the gates of the corresponding third P-type transistor and the corresponding third N-type transistor.

In an embodiment of the invention, the test device further includes a comparison circuit coupled to the current replication circuit and comparing the test result signal with a reference signal to output a comparison signal.

In an embodiment of the invention, the device under test includes a chip under test.

In an embodiment of the invention, the operational amplifier includes a single-stage operational amplifier, a two-stage operational amplifier, a telescopic operational amplifier, or a folded cascode operational amplifier.

Based on the above, the current replication circuit of an embodiment of the invention copies the current flowing through the charging circuit and the discharge circuit according to the voltages of the control terminals of the charging circuit and the discharge circuit in the operational amplifier and outputs a test result signal, thus effectively improving the accuracy and test efficiency of the chip test.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
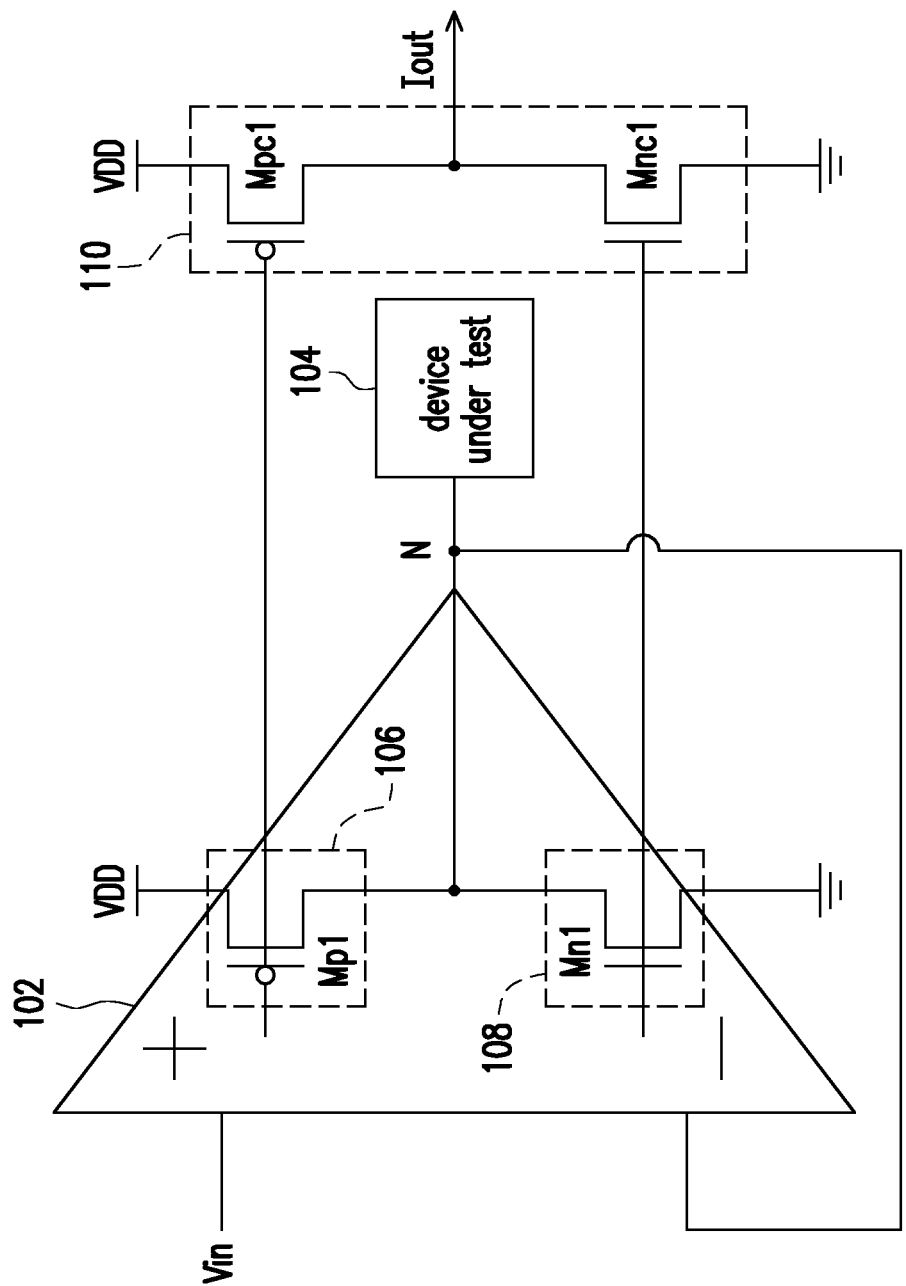
FIG. 1 is a schematic of a test device according to an embodiment of the invention.

FIG. 1 is a schematic of a test device according to an embodiment of the invention. A test device includes an operational amplifier 102 and a current replication circuit 110. The output terminal of the operational amplifier 102 is coupled to a device under test 104 to output a voltage to the device under test 104. The device under test 104 may be, for example, a chip under test (such as a memory chip or a driver chip). However, the device under test 104 may also be, for example, other electronic devices or circuits. Further, the operational amplifier 102 may include a charging circuit 106 and a discharge circuit 108. The charging circuit 106 is coupled to an operating voltage VDD and the output terminal of the operational amplifier 102, and may provide a charging path from the operating voltage VDD of the operational amplifier 102 to the output terminal of the operational amplifier. The discharge circuit 108 is coupled to the output terminal of the operational amplifier 102 and the ground voltage to provide a discharge path from the output terminal of the operational amplifier 102 to the ground voltage. In addition, the output terminal of the operational amplifier 102 is also coupled to the negative input terminal of the operational amplifier 102 to form a negative feedback path, and the positive input terminal of the operational amplifier 102 is used to receive a test voltage Vin. The current replication circuit 110 is coupled to the control terminals of the charging circuit 106 and the discharge circuit 108 to copy the current flowing through the charging circuit 106 and the discharge circuit 108 according to the voltages of the control terminals of the charging circuit 106 and the discharge circuit 108 to output a test result signal (an output current Iout).

In the present embodiment, the charging circuit 106 and the discharge circuit 108 may respectively be implemented, for example, by one P-type transistor Mp1 and one N-type transistor Mn1. The P-type transistor Mp1 and the N-type transistor Mn1 are connected in series between the operating voltage VDD and the ground voltage, and the common junction of the P-type transistor Mp1 and the N-type transistor Mn1, a node N, is coupled to the output terminal of the operational amplifier 102. The current replication circuit 110 may include, for example, one P-type transistor Mpc1 and one N-type transistor Mnc1. The P-type transistor Mpc1 and the N-type transistor Mnc1 are coupled between the operating voltage VDD and the ground voltage, the gates of the P-type transistor Mpc1 and the N-type transistor Mnc1 are respectively coupled to the gates of the P-type transistor Mp1 and the N-type transistor Mn1 to copy the current flowing through the P-type transistor Mp1 and the N-type transistor Mn1, thereby generating an output current Iout (test result signal copying the output terminal current of the operational amplifier 102) for the test machine to determine whether the specification of the device under test 104 meets the expectations according to the output current Iout.

Therefore, by coupling the output terminal of the operational amplifier 102 to the negative input terminal of the operational amplifier 102, the voltage of the output terminal of the operational amplifier 102 may be stabilized to prevent the test results from being affected by factors such as characteristic variations (e.g., corner variations), temperature, or input current level caused by process variations, and as a result the test accuracy of the test device may be improved. In addition, since the circuit structure of the test device may be applied to a test method providing current to the device under test 104 or a test method receiving current from the device under test 104, a current flow direction does not need to be particularly specified for the test device during testing of the device under test 104, thus improving the ease of use of the test device and improving the test efficiency of the test device.

Figure 2:
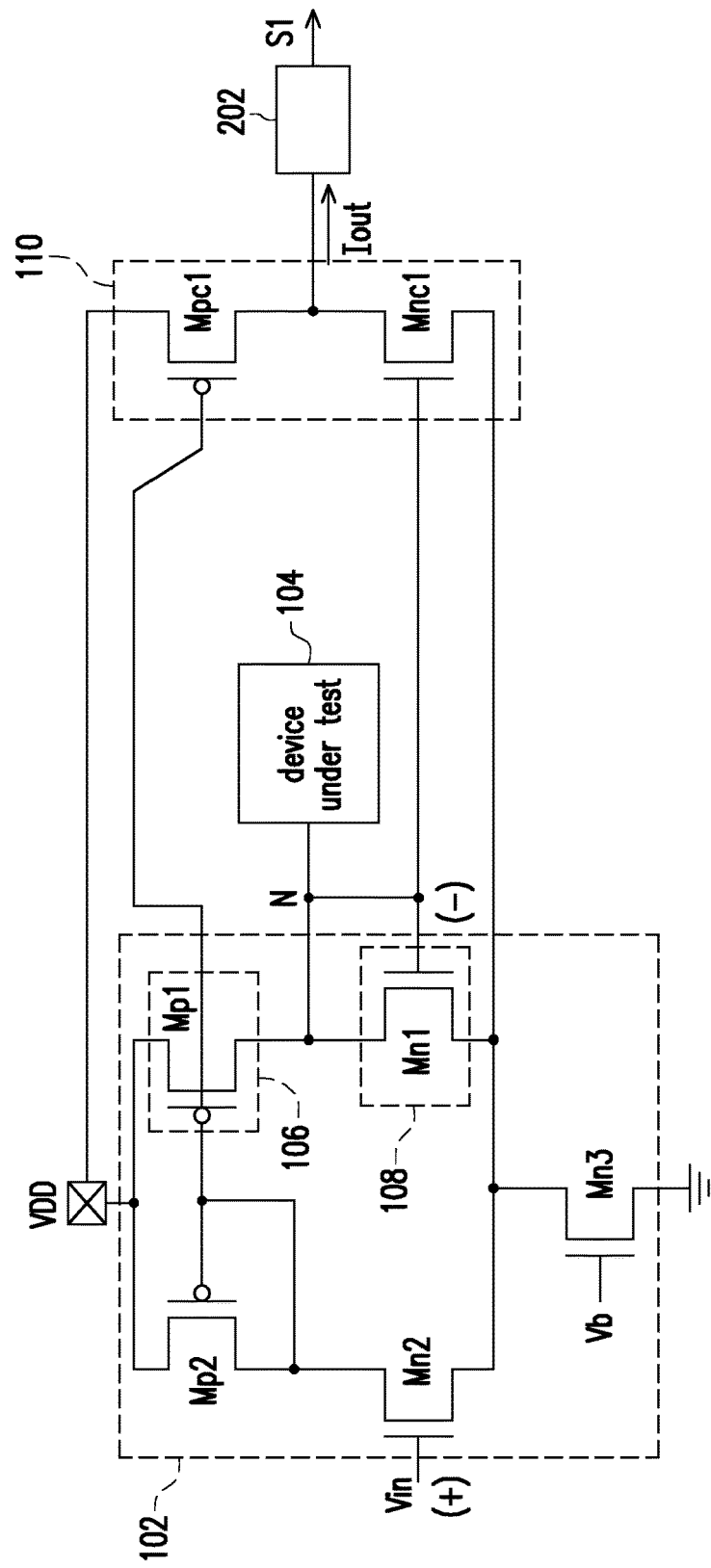
FIG. 2 is a schematic of a test device according to another embodiment of the invention.

FIG. 2 is a schematic of a test device according to another embodiment of the invention. In detail, the test device may be implemented, for example, by the circuit shown in FIG. 2. In the present embodiment, the operational amplifier 102 is a single-stage operational amplifier and may include P-type transistors Mp1 and Mp2 and N-type transistors Mn1 to Mn3. In particular, the sources of the P-type transistors Mp1 and Mp2 are coupled to the operating voltage VDD, the gates of the P-type transistors Mp1 and Mp2 are coupled to each other, the gate and the drain of the P-type transistor Mp2 are coupled to each other, the drain of the N-type transistor Mn2 is coupled to the drain of the P-type transistor Mp2, the drain of N-type transistor Mn1 is coupled to the drain of the P-type transistor Mp1, the sources of the N-type transistor Mn1 and Mn2 are coupled to each other, the N-type transistor Mn3 is coupled between the common junction of the N-type transistors Mn1 and Mn2 and the ground, and the gate of the N-type transistor Mn3 receives a bias voltage Vb and is used as a current source to provide a constant current.

In particular, the gate of the N-type transistor Mn2 is used as the positive input terminal of the operational amplifier 102, the gate of the N-type transistor Mn1 is used as the negative input terminal of the operational amplifier 102, the common junction of the N-type transistor Mn1 and the P-type transistor Mp1, the node N, is used as the output terminal of the operational amplifier 102 and is coupled to the gate of the N-type transistor Mn1 to form a negative feedback path to prevent the test results from being affected by factors such as characteristic variations (e.g., corner variations), temperature, or input current level caused by process variations. The operational amplifier 102 of the present embodiment has a circuit structure of a bidirectional current mirror. Therefore, when testing the device under test 104, a current flow direction does not need to be particularly specified for the test device, such that the ease of used of the test device may be increased, and the test efficiency of the test device may be improved. In addition, since the test voltage Vin of the present embodiment is the gate inputted to the N-type transistor Mn2, only the driving capability for the capacitive load needs to be provided for the test voltage Vin, and a large current driving capability is not needed.

The test device of the present embodiment further includes a comparison circuit 202 coupled to the output terminal of the current replication circuit 110, and the test result signal (the output current Iout) is compared with a reference signal to convert the test result signal into a digital signal to output a comparison signal S1, and the comparison signal S1 is provided to the test machine to determine whether the specification of the device under test 104 conforms to regulations. Therefore, the test result signal is converted into a digital signal and provided to the test machine for determination, and therefore the time needed for the test machine to execute the determination may be shortened and the implementation of automatic testing and determination may be facilitated, such that test efficiency may be further improved.

Figure 3:
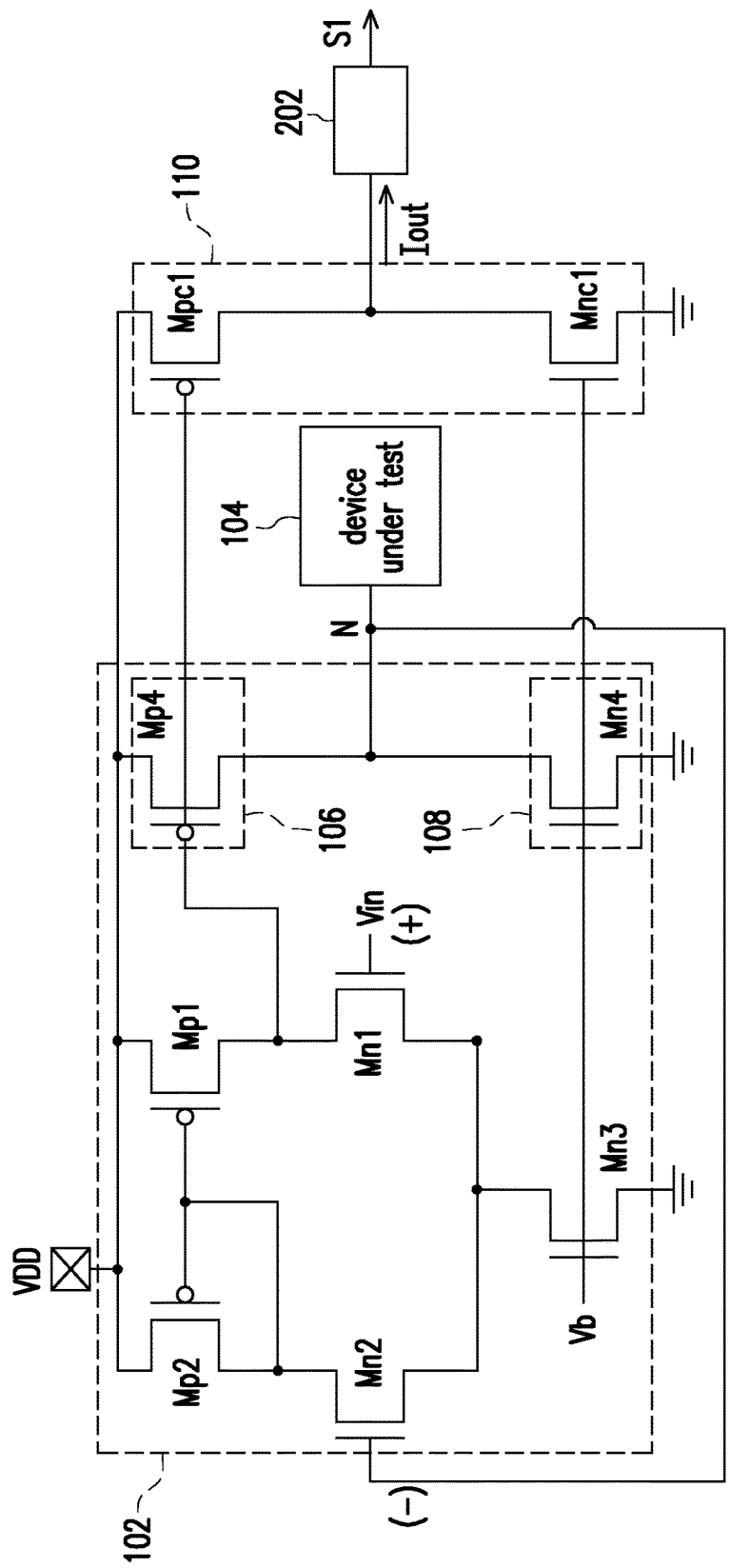
FIG. 3 is a schematic of a test device according to another embodiment of the invention.

FIG. 3 is a schematic of a test device according to another embodiment of the invention. The difference between the test device of the present embodiment and the test device of the embodiment of FIG. 2 is that the operational amplifier 102 of the present embodiment is a two-stage operational amplifier. As shown in FIG. 3, the operational amplifier 102 further includes a P-type transistor Mp4 and an N-type transistor Mn4. The P-type transistor Mp4 and the N-type transistor Mn4 are coupled between the operating voltage VDD and the ground voltage, the gate of the P-type transistor Mp4 is coupled to the common junction of the P-type transistor Mp1 and the N-type transistor Mn1, and the gate of the N-type transistor Mn4 is coupled to the gate of the N-type transistor Mn3. In some embodiments, the gate of the N-type transistor Mn4 may also not be connected to the gate of the N-type transistor Mn3 and is connected to other bias voltages. The common junction of the P-type transistor Mp4 and the N-type transistor Mn4, the node N, is coupled to the device under test 104.

In addition, in the present embodiment, the gate of the N-type transistor Mn1 is used as the positive input terminal of the operational amplifier 102, and the gate of the N-type transistor Mn2 is used as the negative input terminal of the operational amplifier 102 and is coupled to the node N (common junction of the P-type transistor Mp4 and the N-type transistor Mn4) to form a negative feedback path. Similarly, the P-type transistor Mpc1 and the N-type transistor Mnc1 of the current replication circuit 110 of the present embodiment are respectively coupled to the gates of the P-type transistor Mp4 and the N-type transistor Mn4 at the output terminal of the operational amplifier 102 to copy the current flowing through the P-type transistor Mp4 and the N-type transistor Mn4 and generate an output current Iout (test result signal), wherein the output current Iout copies the output terminal current of the operational amplifier 102.

Figure 4:
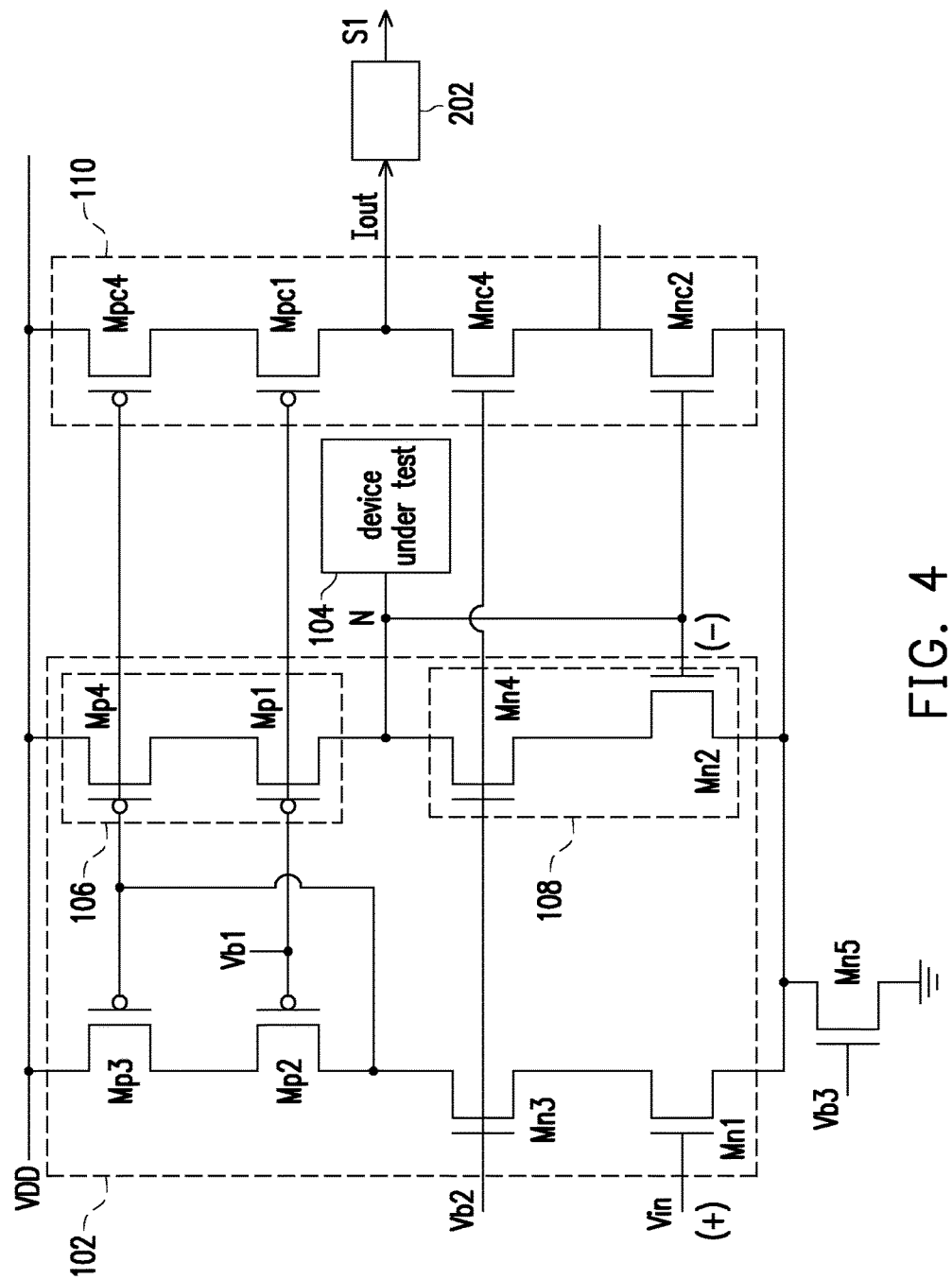
FIG. 4 is a schematic of a test device according to another embodiment of the invention.

It should be noted that the operational amplifier 102 is not limited to the embodiment of FIG. 2 and the embodiment of FIG. 3, and any operational amplifier having circuits similar to the charging circuit 106 and the discharge circuit 108 may be implemented as the operational amplifier 102. For example, FIG. 4 is a schematic of a test device according to another embodiment of the invention. As shown in FIG. 4, the operational amplifier 102 of the present embodiment is a telescopic operational amplifier formed by the P-type transistors Mp1 to Mp4 and N-type transistors Mn1 to Mn5. In particular, the gate of the N-type transistor Mn1 is used as the positive input terminal of the operational amplifier 102, the gate of the N-type transistor Mn2 is used as the negative input terminal of the operational amplifier 102, and the common junction of the P-type transistor Mp1 and the N-type transistor Mn4, the node N, is coupled to the gate of N-type transistor Mn2 to form a negative feedback path. Voltages Vb1 to Vb3 are bias voltages having fixed voltage values.

It should be noted that, in the present embodiment, the charging circuit 106 and the discharge circuit 108 are respectively formed by two P-type transistors Mp1 and Mp4 and two N-type transistors Mn2 and Mn4. Therefore, the current replication circuit 110 of the present embodiment also includes corresponding P-type transistors Mpc1 and Mpc4 and N-type transistors Mnc2 and Mnc4 with gates respectively coupled to gates of the two P-type transistors Mp1 and Mp4 and the two N-type transistors Mn2 and Mn4, and the P-type transistors Mpc1 and Mpc4 and the N-type transistors Mnc2 and Mnc4 form a stacked circuit structure to copy the current flowing through the P-type transistors Mp1 and Mp4 and the N-type transistors Mn2 and Mn4 and generate the output current Iout (test result signal) at the common junction of the P-type transistor Mpc1 and the N-type transistor Mnc4, wherein the output current Iout copies the output terminal current of the operational amplifier 102.

Figure 5:
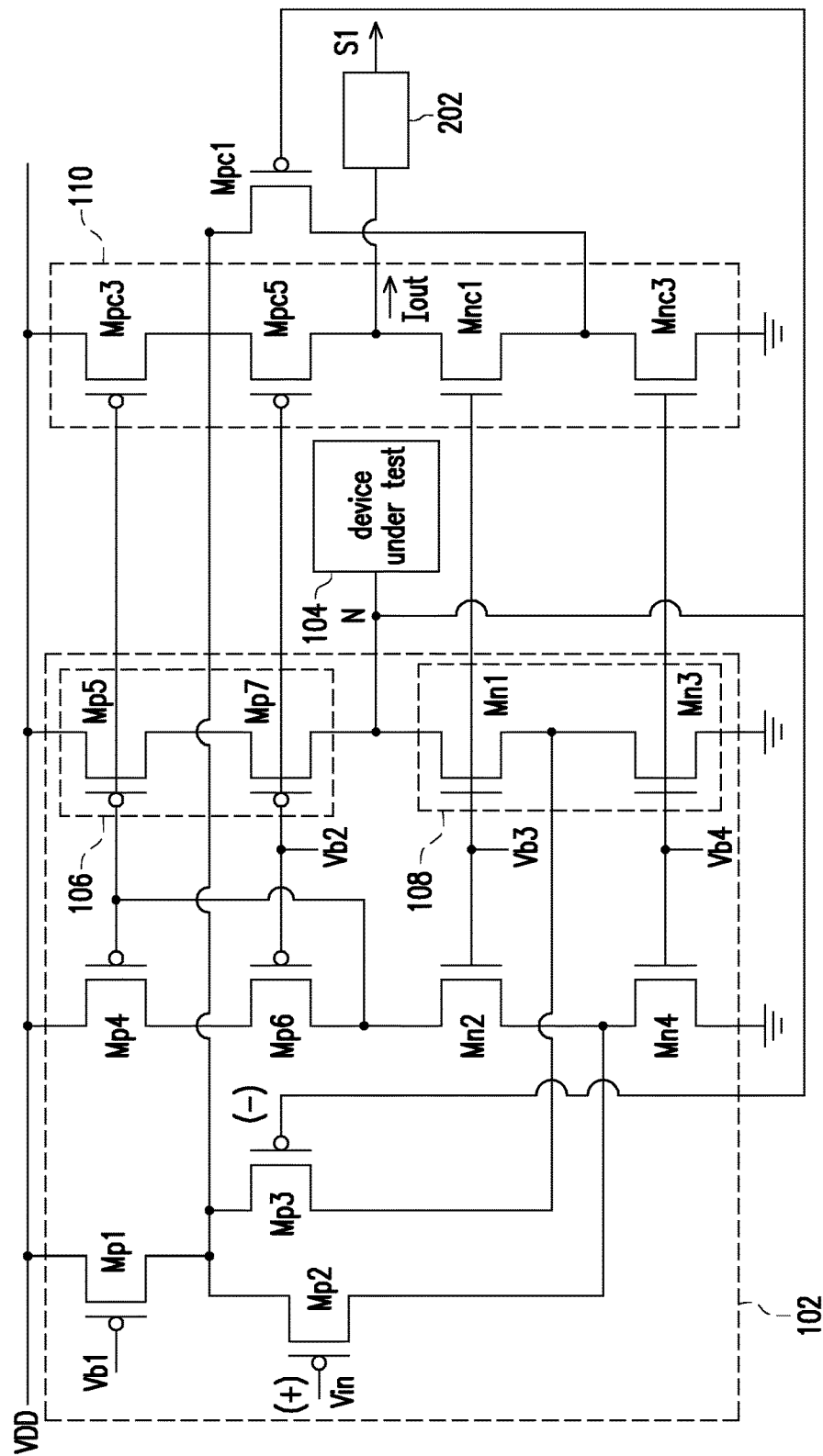
FIG. 5 is a schematic of a test device according to another embodiment of the invention.

As another example, FIG. 5 is a schematic of a device under test according to another embodiment of the invention. The operational amplifier 102 of the embodiment of FIG. 5 is a folded cascode operational amplifier formed by P-type transistors Mp1 to Mp7 and the N-type transistors Mn1 to Mn4. In particular, the gate of the P-type transistor Mp2 is used as the positive input terminal of the operational amplifier 102, the gate of the P-type transistor Mp3 is used as the negative input terminal of the operational amplifier 102, and the common junction of the P-type transistor Mp7 and the N-type transistor Mn1, the node N, is used as the output terminal of operational amplifier 102 coupled to the gate of P-type transistor Mp3 to form a negative feedback path. Voltages Vb1 to Vb4 are bias voltages having fixed voltage values. In the present embodiment, the charging circuit 106 and the discharge circuit 108 are also respectively formed by two P-type transistors Mp5 and Mp7 and two N-type transistors Mn1 and Mn3. Therefore, the current replication circuit 110 of the present embodiment also includes corresponding P-type transistors Mpc3 and Mpc5 and N-type transistors Mnc1 and Mnc3 with gates respectively coupled to gates of the two P-type transistors Mp5 and Mp7 and the two N-type transistors Mn1 and Mn3 to copy the current flowing through the P-type transistors Mp5 and Mp7 and the N-type transistors Mn1 and Mn3 and generate the output current Iout (test result signal) at the common junction of the P-type transistor Mpc5 and the N-type transistor Mnc1, wherein the output current Iout copies the output terminal current of the operational amplifier 102.

It should be noted that the test device of the present embodiment may further include a P-type transistor Mpc1, wherein the source and the drain thereof are respectively coupled to the source of the P-type transistor Mp3 and the drain of the N-type transistor Mnc3, and the gate of the P-type transistor Mpc1 is coupled to the gate of the P-type transistor Mp3 to form another current mirror circuit structure with the P-type transistor Mp3. That is to say, the charging path and the discharge path used to form the current mirror circuit structure in the operational amplifier 102 are not limited to a single charging path and a single discharge path, and different charging paths and different discharge paths may also be simultaneously used to form the current mirror circuit structure to copy the current flowing through different current paths to respectively generate corresponding test result signals to meet different test requirements.

Based on the above, in the embodiments of the invention, by coupling the output terminal of the operational amplifier to the negative input terminal of the operational amplifier, the voltage of the output terminal of the operational amplifier may be stabilized to prevent the test results from being affected by factors such as characteristic variations (e.g., corner variations), temperature, or input current level caused by process variations, and as a result the test accuracy of the test device may be improved. The bidirectional current mirror circuit structure of the test device does not need to particularly specify a current flow direction when testing the device under test, and therefore the ease of use of the test device may be increased and the test efficiency of the test device may be improved. In some embodiments, the comparison circuit in the test device may also convert the test result signal into a digital signal to shorten the time needed for the test machine to execute the determination and facilitate the implementation of automatic testing and determination to further improve test efficiency.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A test device, comprising:
    an operational amplifier, wherein an output terminal of the operational amplifier is coupled to a negative input terminal of the operational amplifier to form a negative feedback path, the operational amplifier comprising:
        a charging circuit providing at least one charging path from an operating voltage of the operational amplifier to the output terminal of the operational amplifier; and
        a discharge circuit coupled to a common junction with the charging circuit and the common junction is coupled to the output terminal of the operational amplifier to provide at least one discharge path from the output terminal of the operational amplifier to a ground voltage, wherein the output terminal of the operational amplifier is coupled to a device under test; and
    a current replication circuit coupled to control terminals of the charging circuit and the discharge circuit and copying a current flowing through the at least one charging path and the at least one discharge path according to voltages of the control terminals of the charging circuit and the discharge circuit to output a test result signal.

2. The test device of claim 1, wherein the charging circuit comprises at least one first P-type transistor, the discharge circuit comprises at least one first N-type transistor, the at least one first P-type transistor is coupled between the operating voltage and the output terminal of the operational amplifier to provide a first charging path, and the at least one first N-type transistor is coupled between the output terminal of the operational amplifier and the ground voltage to provide a first discharge path.

3. The test device of claim 2, wherein the current replication circuit comprises at least one second P-type transistor and at least one second N-type transistor, the at least one second P-type transistor is connected in series between the operating voltage and an output terminal of the current replication circuit, the at least one second N-type transistor is connected in series between the output terminal of the current replication circuit and the ground voltage, and gates of the at least one second P-type transistor and the at least one second N-type transistor are respectively coupled to gates of the corresponding at least one first P-type transistor and the corresponding at least one first N-type transistor.

4. The test device of claim 3, wherein the charging circuit further comprises at least one third P-type transistor, the discharge circuit comprises at least one third N-type transistor, the at least one third P-type transistor and the at least one third N-type transistor are connected in series between the operating voltage and the ground voltage, the at least one third P-type transistor provides a second charging path, and the at least one third N-type transistor provides a second discharge path.

5. The test device of claim 4, wherein the current replication circuit further comprises at least one fourth P-type transistor and at least one fourth N-type transistor, the at least one fourth P-type transistor and the at least one fourth N-type transistor are connected in series between the operating voltage and the ground voltage, and gates of the at least one fourth P-type transistor and the at least one fourth N-type transistor are respectively coupled to gates of the corresponding at least one third P-type transistor and the corresponding at least one third N-type transistor.

6. The test device of claim 1, further comprising:
    a comparison circuit coupled to the current replication circuit to compare the test result signal with a reference signal to output a comparison signal.

7. The test device of claim 1, wherein the device under test comprises a chip under test.

8. The test device of claim 1, wherein the operational amplifier comprises a single-stage operational amplifier.

9. The test device of claim 8, wherein the charging circuit comprises a first P-type transistor, a source and a drain of the first P-type transistor are respectively coupled to the operating voltage and the device under test, a gate of the first P-type transistor is coupled to the current replication circuit, the discharge circuit comprises a first N-type transistor, a drain of the first N-type transistor is coupled to the drain of the first P-type transistor, and a gate of the first N-type transistor is coupled to the drain of the first N-type transistor and the current replication circuit, the operational amplifier further comprising:
    a second P-type transistor, wherein a source and a gate of the second P-type transistor are respectively coupled to the operating voltage and the gate of the first P-type transistor, and the gate and a drain of the second P-type transistor are coupled to each other;
    a second N-type transistor, wherein a drain of the second N-type transistor is coupled to the drain of the second P-type transistor, and a gate of the second N-type transistor receives a test voltage; and
    a third N-type transistor, wherein a drain of the third N-type transistor is coupled to sources of the first N-type transistor and the second N-type transistor, a source of the third N-type transistor is coupled to the ground voltage, and a gate of the third N-type transistor receives a bias voltage.

10. The test device of claim 1, wherein the operational amplifier comprises a two-stage operational amplifier.

11. The test device of claim 10, wherein the operational amplifier further comprises:
    a first P-type transistor, wherein a source of the first P-type transistor is coupled to the operating voltage;
    a first N-type transistor, wherein a drain of the first N-type transistor is coupled to a drain of the first P-type transistor, and a gate of the first N-type transistor receives a test voltage;
    a second P-type transistor, wherein a source and a gate of the second P-type transistor are respectively coupled to the operating voltage and a gate of the first P-type transistor, and the gate and a drain of the second P-type transistor are coupled to each other;
    a second N-type transistor, wherein a drain of the second N-type transistor is coupled to the drain of the second P-type transistor; and
    a third N-type transistor, wherein a drain of the third N-type transistor is coupled to sources of the first N-type transistor and the second N-type transistor, a source of the third N-type transistor is coupled to the ground voltage, a gate of the third N-type transistor receives a bias voltage, the charging circuit comprises a fourth P-type transistor, a source and a drain of the fourth P-type transistor are respectively coupled to the operating voltage and the device under test, a gate of the fourth P-type transistor is coupled to the drain of the first P-type transistor and the current replication circuit, the discharge circuit comprises a fourth N-type transistor, a drain of the fourth N-type transistor is coupled to the drain of the fourth P-type transistor and a gate of the second N-type transistor, a gate of the fourth N-type transistor is coupled to the gate of the third N-type transistor, and a source of the fourth N-type transistor is coupled to the ground voltage.

12. The test device of claim 1, wherein the operational amplifier comprises a telescopic operational amplifier.

13. The test device of claim 12, wherein the charging circuit comprises a first P-type transistor and a fourth P-type transistor, and the discharge circuit comprises a second N-type transistor and a fourth N-type transistor, the operational amplifier further comprising:
  a second P-type transistor, wherein a gate of the second P-type transistor is coupled to a gate of the first P-type transistor and receives a first bias voltage;
  a third P-type transistor, wherein a gate of the third P-type transistor is coupled to a gate of the fourth P-type transistor and a drain of the second P-type transistor, the first P-type transistor and the fourth P-type transistor are connected in series between the operating voltage and the device under test, and the gates of the first P-type transistor and the fourth P-type transistor are coupled to the current replication circuit;
  a first N-type transistor, wherein a gate of the first N-type transistor receives a test voltage;
  a third N-type transistor coupled between the second P-type transistor and the first N-type transistor, and a gate of the third N-type transistor receives a second bias voltage; and
  a fifth N-type transistor, wherein a drain of the fifth N-type transistor is coupled to sources of the first N-type transistor and the second N-type transistor, a source of the fifth N-type transistor is coupled to the ground voltage, a gate of the fifth N-type transistor receives a third bias voltage, the second N-type transistor and the fourth N-type transistor are coupled between a drain of the first P-type transistor and the fifth N-type transistor, a gate of the second N-type transistor is coupled to a drain of the fourth N-type transistor and the current replication circuit, and a gate of the fourth N-type transistor is coupled to the gate of the third N-type transistor and the current replication circuit.

14. The test device of claim 1, wherein the operational amplifier comprises a folded cascode operational amplifier.

15. The test device of claim 14, wherein the charging circuit comprises a fifth P-type transistor and a seventh P-type transistor, and the discharge circuit comprises a first N-type transistor and a third N-type transistor, the operational amplifier further comprising:
  a first P-type transistor, wherein a gate of the first P-type transistor receives a first bias voltage, and a source of the first P-type transistor is coupled to the operating voltage;
  a second P-type transistor, wherein a source of the second P-type transistor is coupled to a drain of the first P-type transistor, and a gate of the second P-type transistor receives a test voltage;
  a third P-type transistor, wherein a source of the third P-type transistor is coupled to the drain of the first P-type transistor, and a gate of the third P-type transistor is coupled to a drain of the seventh P-type transistor;
  a fourth P-type transistor, wherein a gate of the fourth P-type transistor is coupled to a gate of the fifth P-type transistor, and a source of the fourth P-type transistor is coupled to the operating voltage;
  a sixth P-type transistor, wherein a gate of the sixth P-type transistor is coupled to a gate of the seventh P-type transistor and receives a second bias voltage, a drain of the sixth P-type transistor is coupled to the gate of the fourth P-type transistor, the fifth P-type transistor and the seventh P-type transistor are connected in series between the operating voltage and the device under test, and the gates of the fifth P-type transistor and the seventh P-type transistor are coupled to the current replication circuit;
  a second N-type transistor; and
  a fourth N-type transistor and the second N-type transistor are coupled between the sixth P-type transistor and the ground voltage, wherein a gate of the second N-type transistor receives a third bias voltage, a gate of the fourth N-type transistor receives a fourth bias voltage, a drain of the fourth N-type transistor is coupled to the drain of the second P-type transistor, the first N-type transistor and third N-type transistor are coupled between the drain of the seventh P-type transistor and the ground voltage, a gate of the first N-type transistor is coupled to the gate of the second N-type transistor and the current replication circuit, a gate of the third N-type transistor is coupled to the gate of the fourth N-type transistor and the current replication circuit, and a drain of the third N-type transistor is coupled to a drain of the third P-type transistor.

* * * * *